United States Patent [19]
Leuthold

[11] Patent Number: 5,909,151
[45] Date of Patent: *Jun. 1, 1999

[54] RING OSCILLATOR CIRCUIT

[75] Inventor: Oskar N. Leuthold, Santa Cruz, Calif.

[73] Assignee: Mitel Semiconductor Americas Inc., San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/769,578

[22] Filed: Dec. 19, 1996

Related U.S. Application Data

[63] Continuation of application No. 08/641,201, Apr. 30, 1996, abandoned, which is a continuation of application No. 08/505,367, Jul. 20, 1995, abandoned, which is a continuation of application No. 08/110,296, Aug. 20, 1993, abandoned.

[51] Int. Cl.$^6$ .................. H03K 3/00; H03K 3/03
[52] U.S. Cl. .................. 331/57; 331/DIG. 3; 327/176
[58] Field of Search .................. 331/57, DIG. 3; 377/69, 72, 44; 327/164, 166, 176, 182, 172; 326/108, 93

[56] References Cited

U.S. PATENT DOCUMENTS

| | | | |
|---|---|---|---|
| 3,350,659 | 10/1967 | Henn | 331/45 X |
| 3,535,544 | 10/1970 | De Troye | 307/291 |
| 4,939,384 | 7/1990 | Shikata et al. | 307/291 |
| 5,239,274 | 8/1993 | Chi | 331/57 |

FOREIGN PATENT DOCUMENTS

| 679136 | 1/1964 | Canada | 331/57 |
|---|---|---|---|

OTHER PUBLICATIONS

"Multihase Clocking Achieves 100–Nsec MOS Memory" by L. Boysel et al, EDN Jun. 10, 1968, pp. 50–55.

"Wide–Range Multivibrator Using Integrated Circuits" by F. May, Electronic Applications vol. 29, No. 4, Publ. 1969, pp. 125–128.

Buchwald, A.W. and Martin, K.W., "High Speed Voltage–Controlled Oscillator with Quadrature Outputs," Electronics Letters, Feb. 14, 1991, vol. 27, No. 4, pp. 309–310.

*Primary Examiner*—Arnold Kinkead
*Attorney, Agent, or Firm*—Fenwick & West LLP

[57] ABSTRACT

A ring oscillator includes a set of metal-oxide-semiconductor (MOS) complementary, inverting stages, wherein each stage includes a pair of cross-coupled CMOS NAND or NOR gates. The first and last stages are also cross-coupled, such that positive and negative output signals of the last stage are connected respectively to negative and positive input signals of the first stage.

9 Claims, 8 Drawing Sheets

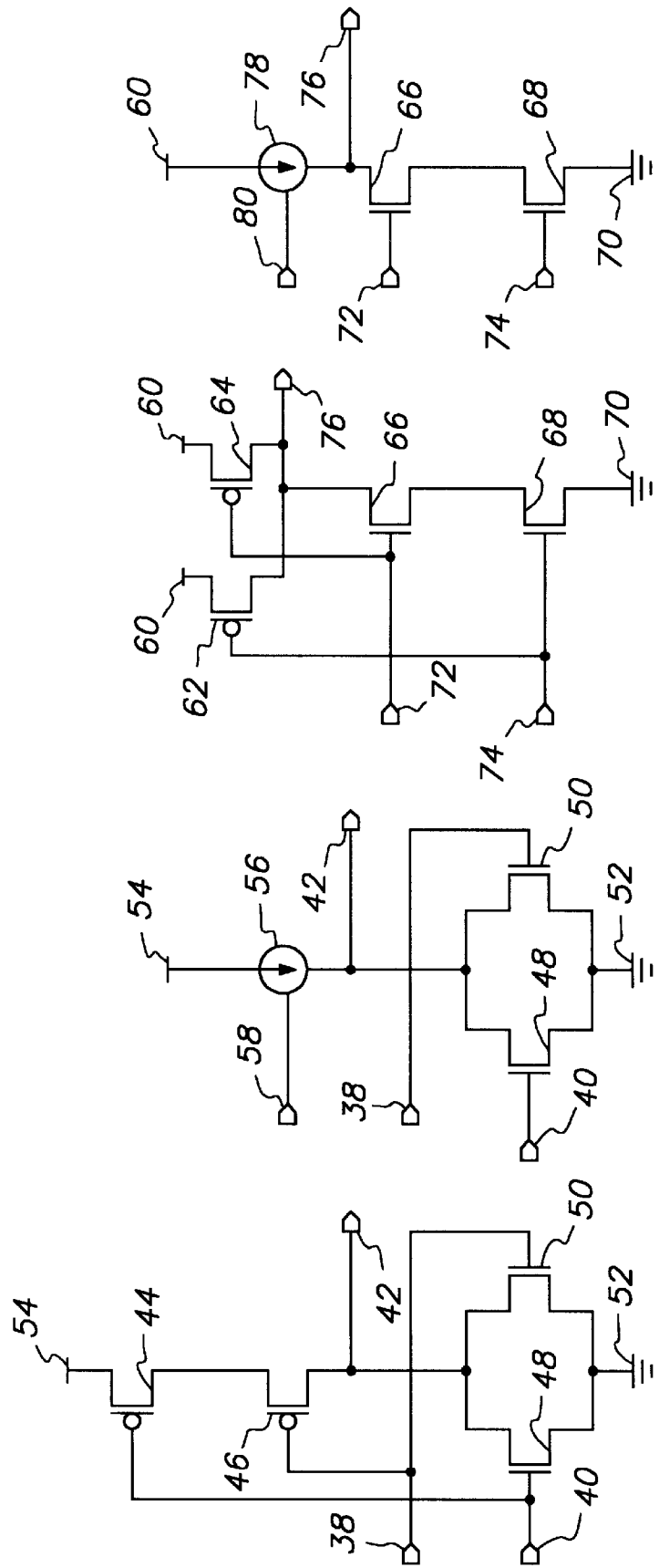

RING OSCILLATOR CIRCUIT

RELATED APPLICATIONS

This is a continuation of application Ser. No. 08/641,201 filed on Apr. 30, 1996, now abandoned, which is a continuation of application Ser. No. 08/505,367 filed on Jul. 20, 1995, now abandoned, which is a continuation of application Ser. No. 08/110,296 filed on Aug. 20, 1993, now abandoned.

BACKGROUND OF THE INVENTION

1. Field of the Invention

The invention relates to electronic circuits, particularly to electronic oscillator circuits.

2. Description of the Background Art

Oscillator circuits are used in electronic system and circuit designs for generating clock signals or other periodic signals which vary current or voltage of a generated signal sinusoidally or alternately between maximum and minimum levels. Oscillator circuits are also used for generating periodic signals having a phase which is specified relative to other periodic signals.

A common technique for generating oscillating signals using metal-oxide-semiconductor (MOS) technology is by coupling an odd set of inverting MOS circuits or stages serially in a ring, such that a signal or pulse may be propagated cyclically within the stages in the ring. In this ring arrangement, the oscillating signal may be obtained from one of the stage outputs, while the pulse is cycled therein.

Such known ring oscillators, however, generate typically only an odd number of signal phases. Thus, it would be desirable to provide an improved MOS-type ring oscillator which generates any number of signal phases.

SUMMARY OF THE INVENTION

The invention resides in providing a ring oscillator including a set of metal-oxide-semiconductor (MOS) complementary, inverting stages, wherein each stage includes a pair of cross-coupled NAND or NOR gates. The first and last stages are also cross-coupled, such that positive and negative output signals of the last stage are connected respectively to negative and positive input signals of the first stage.

BRIEF DESCRIPTION OF THE DRAWINGS

FIGS. 2 and 3 are schematic diagrams of NOR gates, and

FIGS. 4 and 5 are schematic diagrams of NAND gates.

DESCRIPTION OF THE PREFERRED EMBODIMENT

Figure 1:
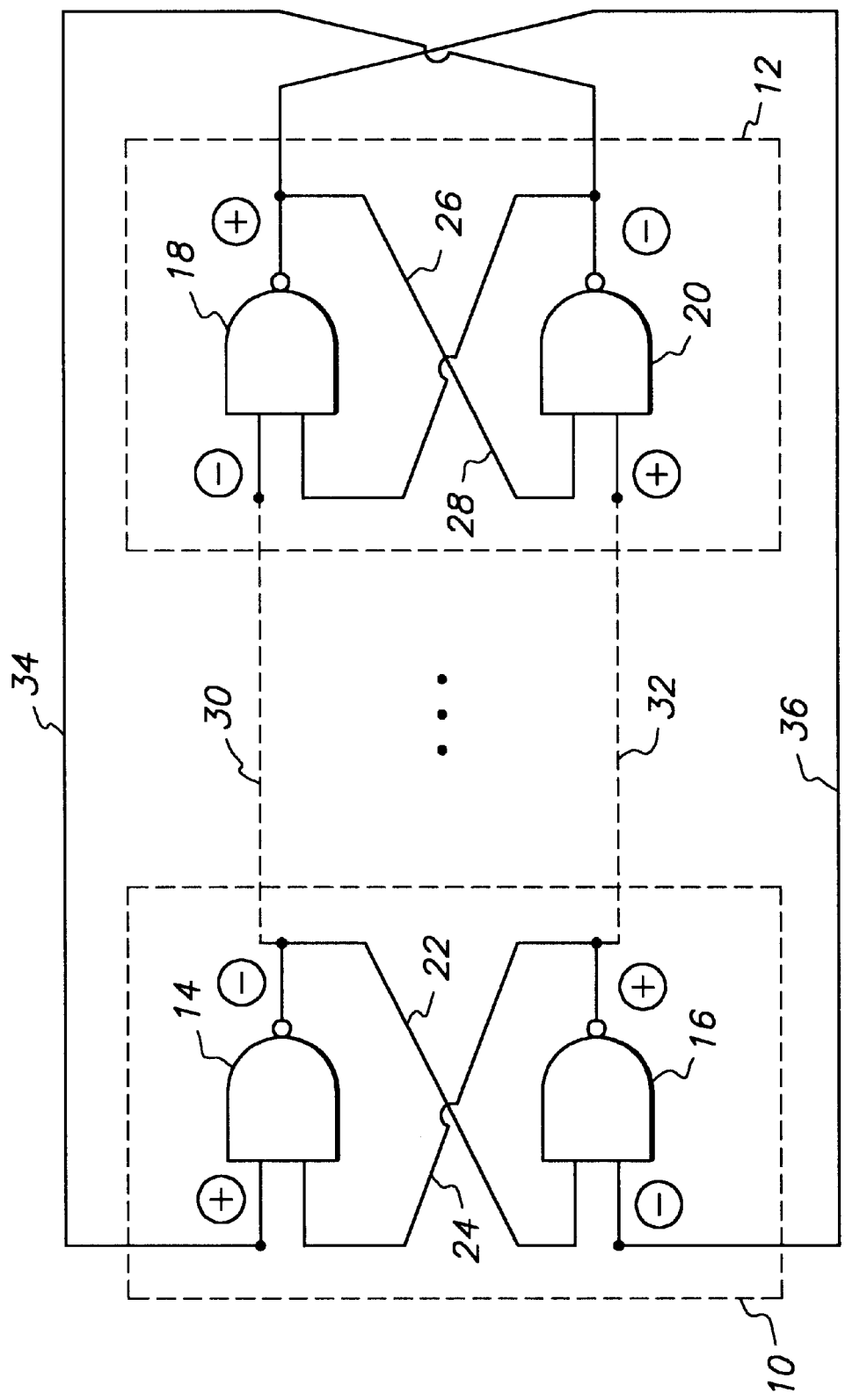
FIG. 1 is a schematic block diagram of a ring oscillator, showing stages 10, 12 which are inter-coupled 34, 36 according to the present invention.

FIG. 1 is a schematic block diagram of an improved design for a ring oscillator circuit. The ring oscillator includes an odd or even set of metal-oxide-semiconductor (MOS) circuit stages 10, 12 which are coupled 30, 32, 34, 36 in series.

Each stage 10, 12 includes a pair of cross-coupled 22, 24, 26, 28 NAND (or NOR) gates 14, 16, 18, 20. Also, each stage 10, 12 includes an input, an "inverted" input, an output, and an "inverted" output node, pin or signal line. In this way, each stage receives an electrical signal or pulse at the input and generates the same signal at the output, and each stage receives another "inverted" signal or pulse, which is an inverse of the first signal, and generates the same inverted signal at the inverted output.

The output of last stage 12 is coupled 36 to the inverted input of first stage 10, and the inverted output of last stage 12 is coupled 34 to the input of first stage 10. In this cross-coupled manner, the signal generated by the output of last stage 12 is received 36 as the inverted signal at the inverted input of first stage 10, and the inverted signal generated by the inverted output of last stage 12 is received 34 as the signal at the input of first stage 10.

Additionally, the output of first stage 10 is coupled 32 directly or indirectly to the input of last stage 12, and the inverted output of first stage 10 is coupled 30 directly or indirectly to the inverted input of last stage 12. In this way, the signal which is generated at the output of first stage 10 is received 32 directly or indirectly as the same signal at the input of last stage 12, and the inverted signal which is generated at the inverted output of first stage 10 is received 30 directly or indirectly as the same inverted signal at the inverted input of last stage 12.

In particular, indirect coupling 30, 32 between first and last stages 10, 12 is enabled by intermediate, similar stages, which may be disposed for serial interconnection therebetween 30, 32. In this way, the output of first stage 10 may be coupled to an "intermediate" input of an intermediate stage, and the inverted output of first stage 10 may be coupled to an "intermediate" inverted input of such intermediate stage. Furthermore, the input of last stage 12 may be coupled to an "intermediate" output of an intermediate stage, and the inverted input of last stage 12 may be coupled to an "intermediate" inverted output of such intermediate stage.

FIGS. 2 and 3 are schematic diagrams of NOR gates, and FIGS. 4 and 5 are schematic diagrams of NAND gates. In accordance with the present invention, each first, last or intermediate stage includes a pair of such cross-coupled NAND or NOR logic gates, preferably assembled from complementary metal-oxide-semiconductor (CMOS) components (i.e., having p-channel or n-channel transistors) or a bipolar variety (bi-CMOS) thereof, to reduce power consumption.

Thus, for example, in FIG. 2, 2-input CMOS NOR gate having inputs 38, 40 and output 42 is assembled as shown using n-channel transistors 48, 50 and p-channel transistors 44, 46, coupled to power 54 and ground 52. Additionally, in FIG. 4, 2-input CMOS NAND gate having inputs 72, 74 and output 76 is assembled as shown using n-channel transistors 66, 68 and p-channel transistors 62, 64, coupled to power 60 and ground 70.

Alternately, in applications where oscillator frequency needs to be controlled, the 2-input CMOS NOR gate of FIG. 2 may be modified as shown in FIG. 3 to include a voltage-controlled 58 current source 56, for controlling the signal-switching speed of the ring oscillator. Similarly, the 2-input CMOS NAND gate of FIG. 4 may be modified as shown in FIG. 5 to include a voltage-controlled 80 current source 78, for controlling signal-switching speed.

Figure 6:
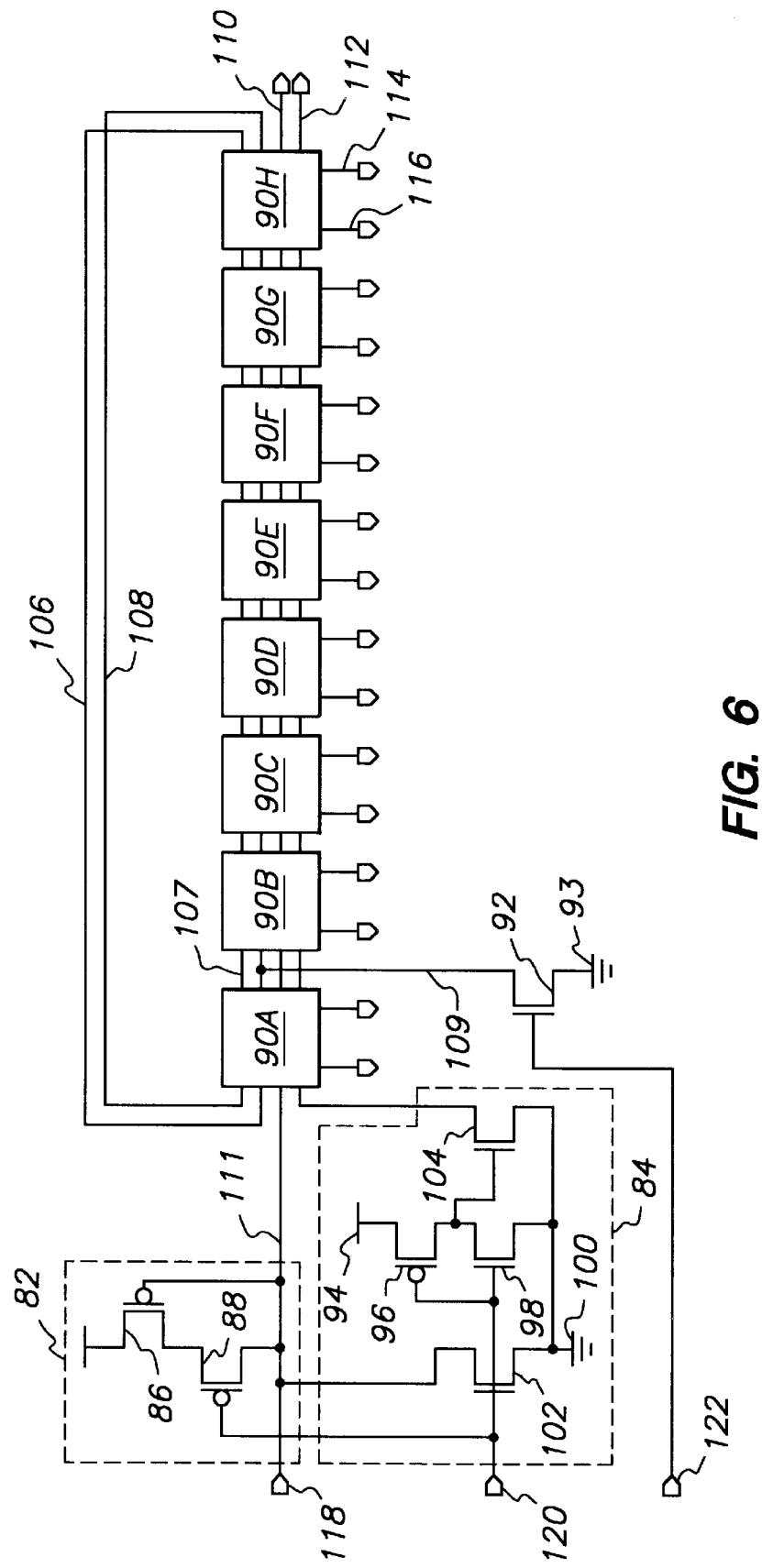
FIG. 6 is a schematic block diagram of a ring oscillator having eight stages 90A–90H.

In FIG. 6, a schematic block diagram of a ring oscillator having eight stages 90(A–H) is shown. In this arrangement, each stage 90 includes (on the right-hand side of the stage block symbol:) an output 107, an "inverted" output 109, an out-going bias voltage 110, an out-going sink or ground line 112, (on the bottom side of the stage block symbol:) monitor line 114, "inverted" monitor line 116, (on the left-hand side of the stage block symbol:) input 108, "inverted" input 106, in-coming bias voltage 111, and incoming sink or ground line 112.

Figure 7:
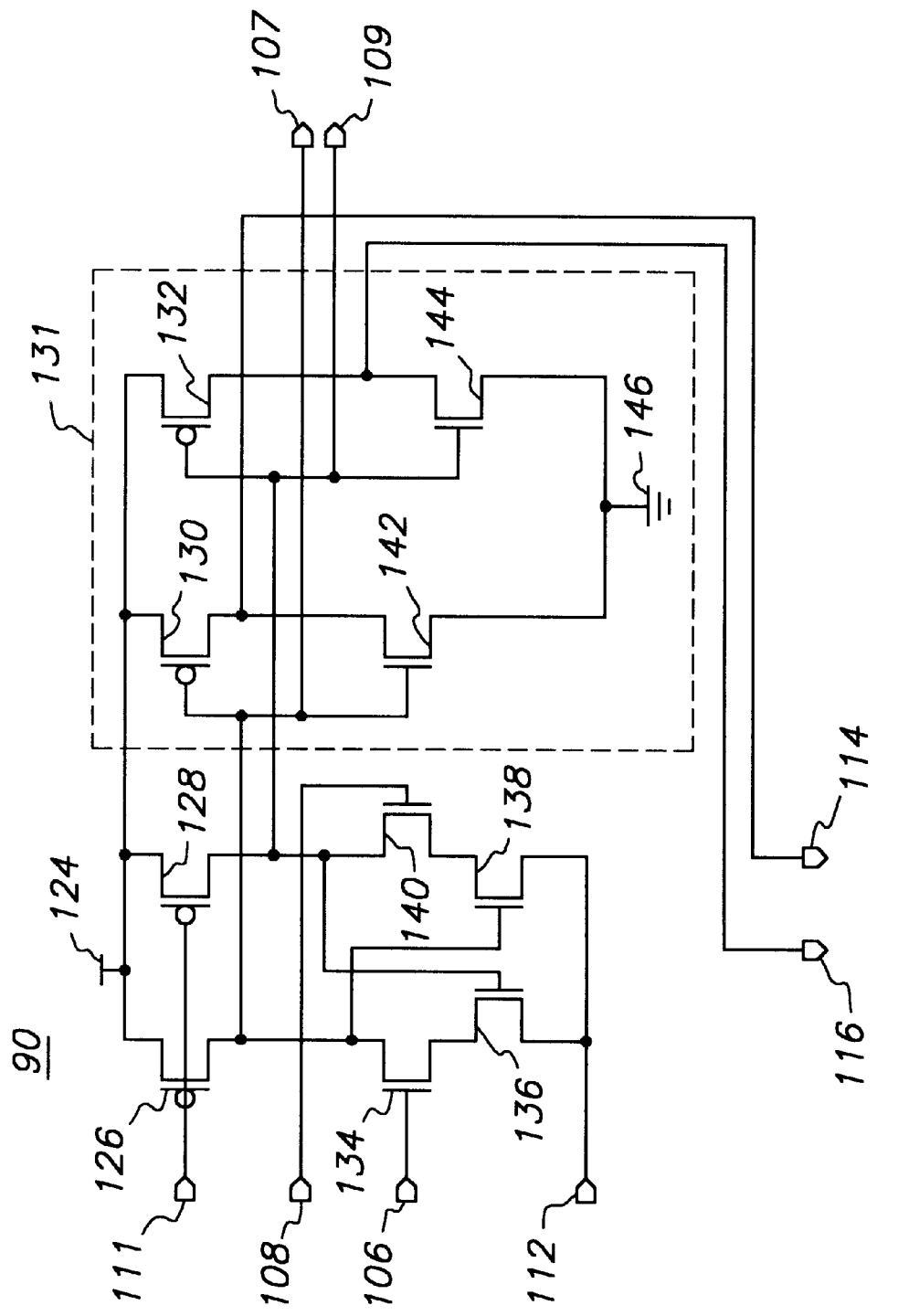
FIG. 7 is a schematic diagram of one of the eight stages 90A–90H which may be used in the ring oscillator of FIG. 6.
Figure 8A:
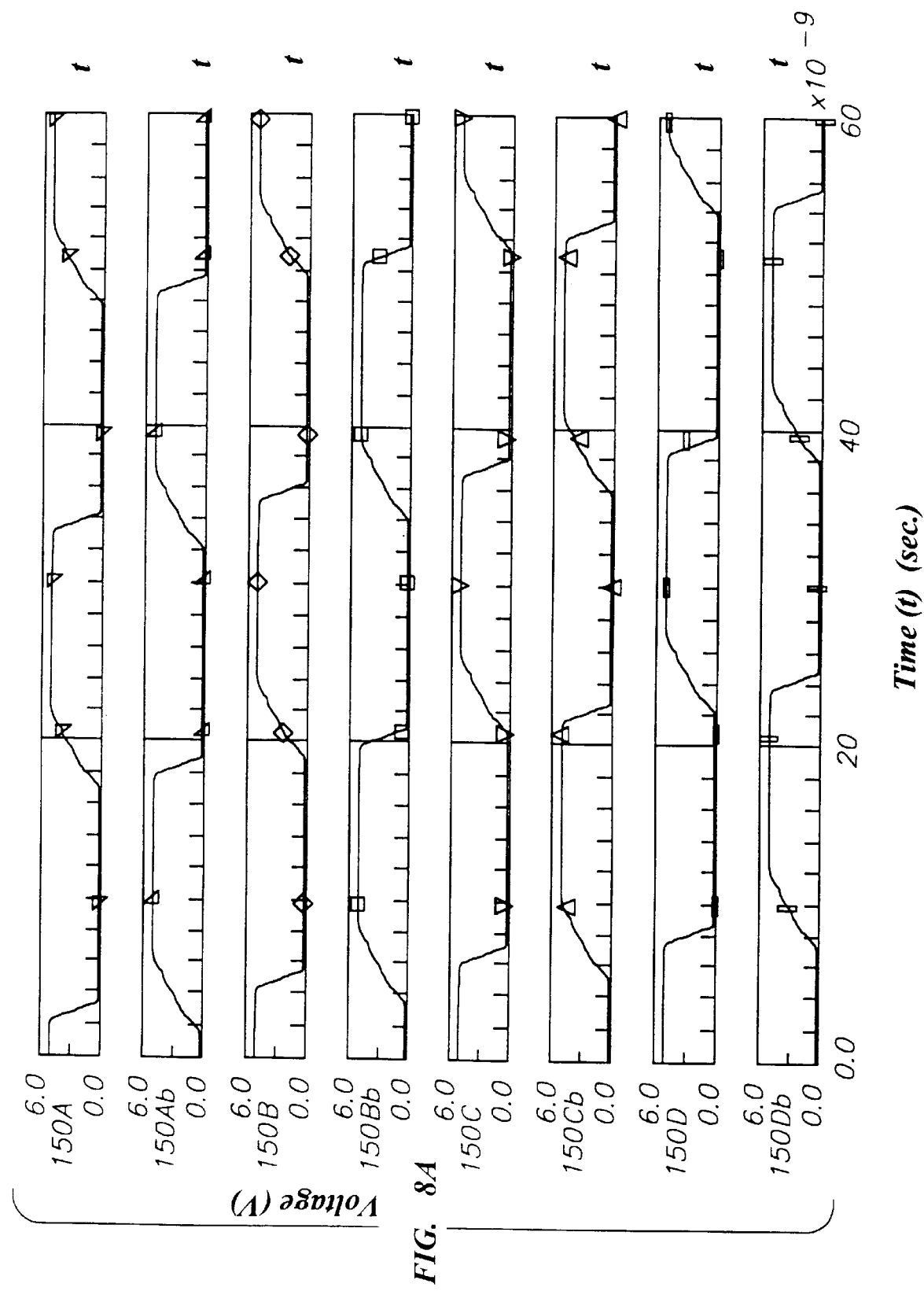
FIGS. 8(A–D) include timing diagrams of representative signal pulses 150(A–H), 151(A–H) generated by ring oscillator of FIG. 6.
Figure 8B:
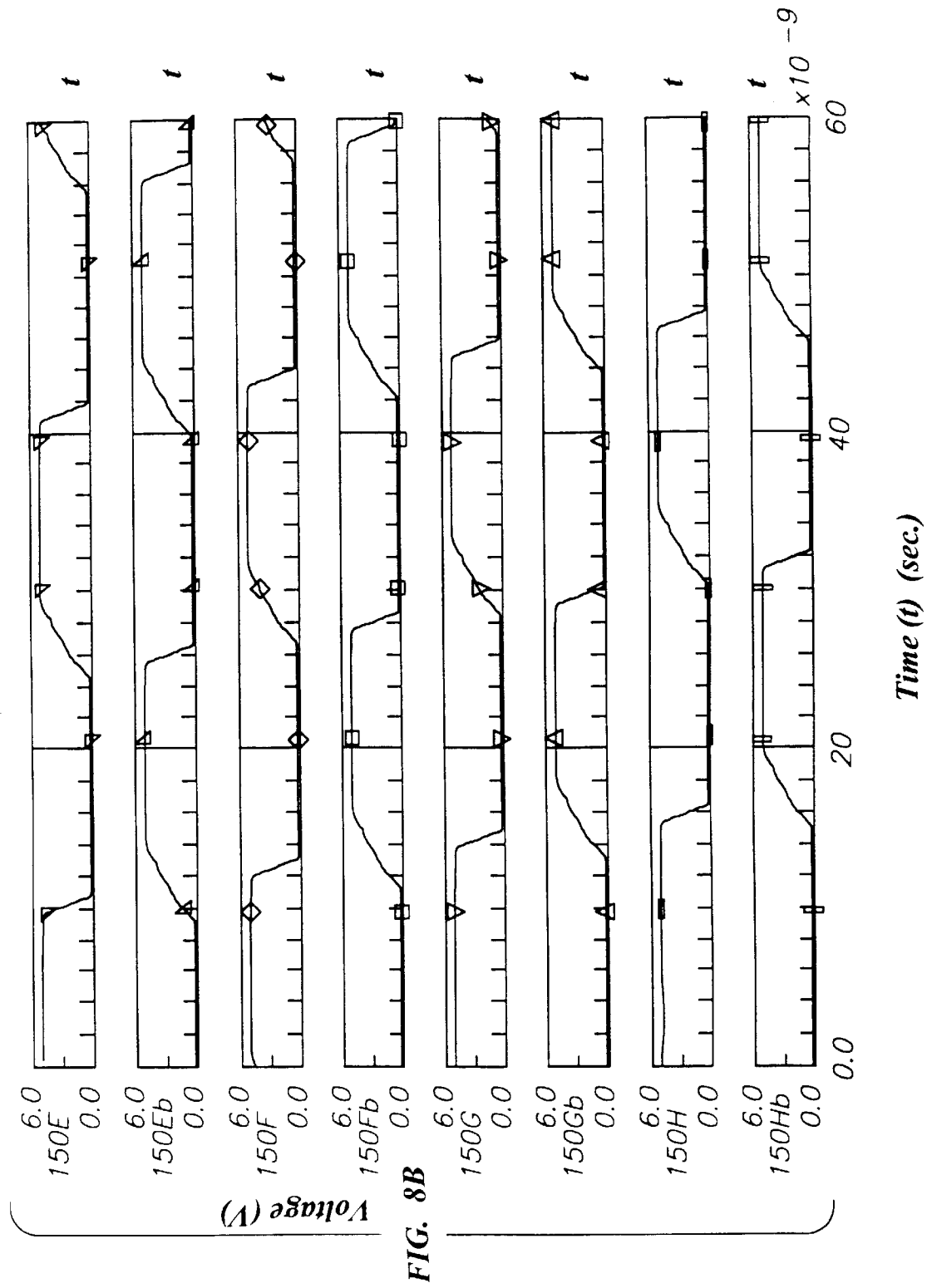
Figure 8C:
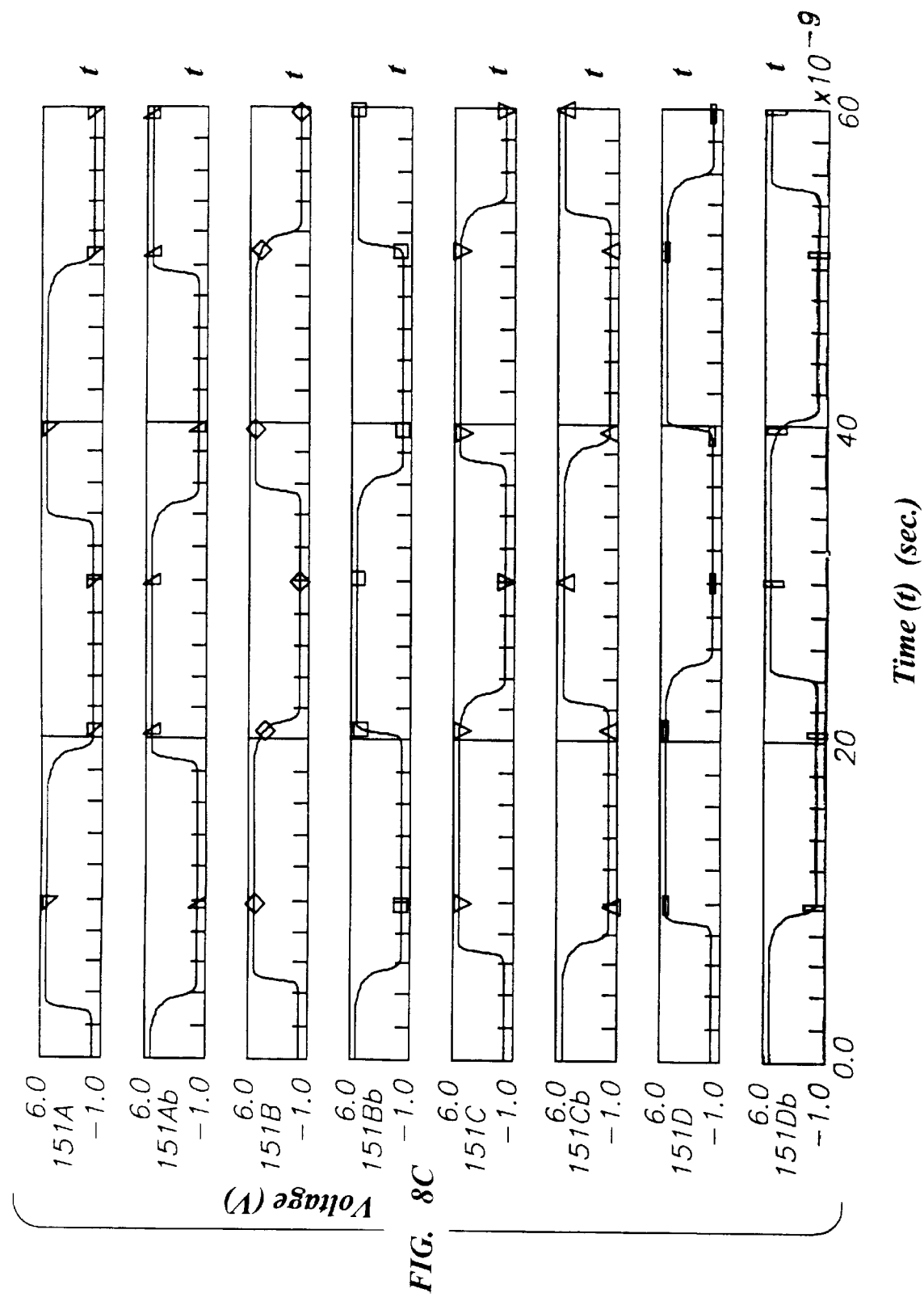
Figure 8D:
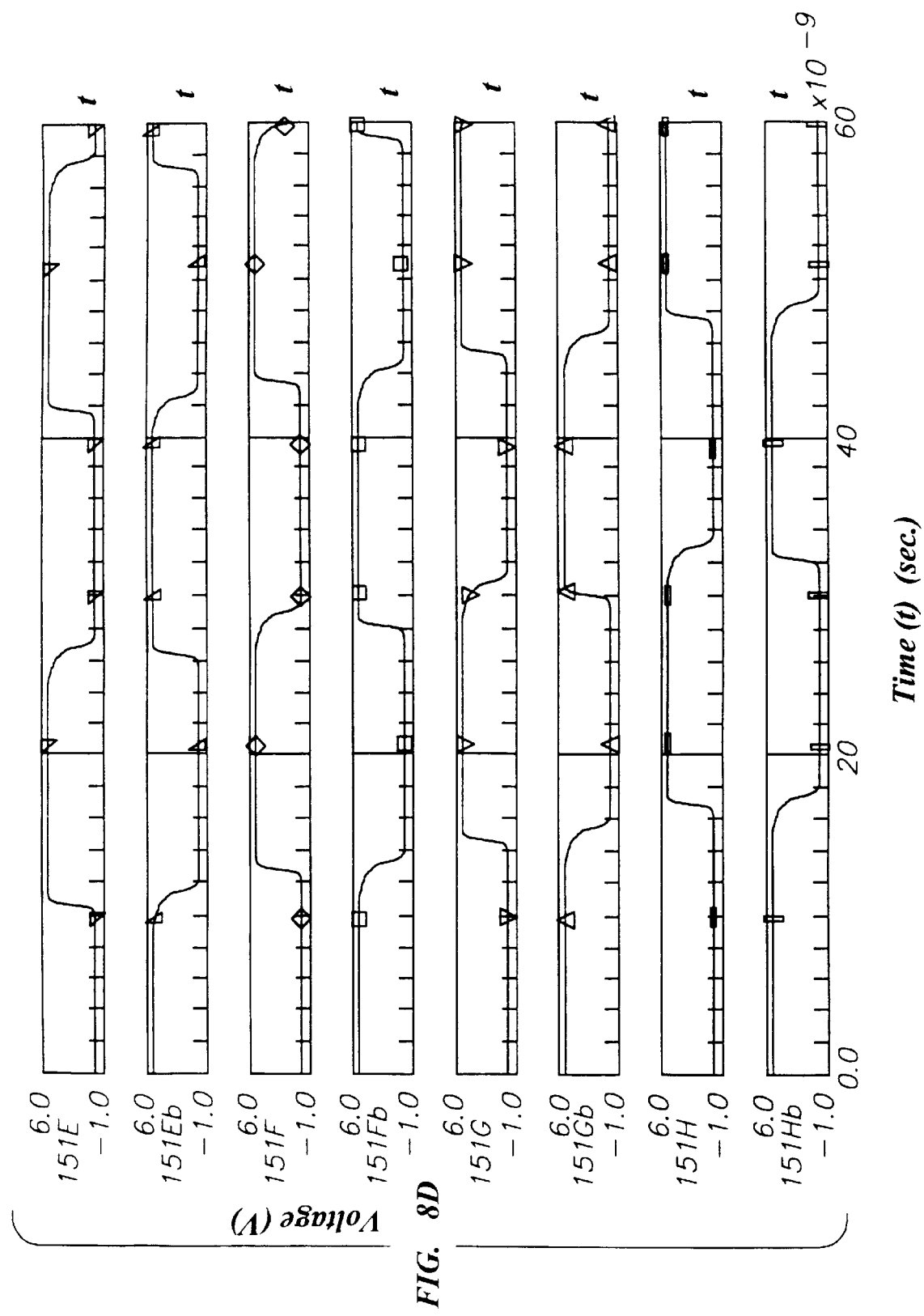

In FIG. 7, a schematic diagram of one of the eight stages 90A–90H is shown, wherein the stage 90 is a 2-input CMOS NAND gate having bias voltage 111, input 108, inverted input 106, sink 112, output 107, inverted output 109, monitor 116, and inverted monitor 114. As shown in this arrangement, p-channel transistors 126, 128 and n-channel transistors 134, 136, 138, 140 define the cross-coupled NAND circuit. Optionally, 2-buffer stages 131 are provided with p-channel transistors 130, 132 and n-channel transistors, coupled to power 124 and ground 146.

As shown in FIG. 6, the 8-stage ring oscillator includes current mirror 82 using p-channel transistors 86, 88 for generating bias voltage 111 from bias or control current 118. In addition, the ring oscillator may include shut-down circuit 84 which receives shut-down signal 120, includes p-channel transistor 96 and n-channel transistors 98, 100, 102, coupled to power 94, and may couple stages 90 sink 112 to ground 100. Also, reset signal 122 may be received by n-channel transistor 92 to initialize inverted output 109 to ground state 93.

FIGS. 8(A–D) include timing diagrams of representative signal pulses 150, 151 generated by 8-stage ring oscillator of FIG. 6. In particular, representative signals 150X and 150Xb correspond respectively with output signal 107 and inverted output signal 109, and signals 151X and 151Xb correspond respectively with monitor 114 and inverted monitor 116 signals, as generated by stages 90(A–H), where X=A, B, C, D, E, F, G, or H.

As shown, signals 150X, 151X are inverted to provide respectively signals 150Xb, 151Xb, wherein some time delay of the stage inversion arises between corresponding signals 150X/150Xb, 151X/151Xb, and also between consecutive stages 90.

Preferably, the signals generated by stages 90 (i.e., in sequence A-B-C-D-E-F-G-H-Ab-Cb-Db-Eb-Fb-Gb-Hb- . . . ) are equally spaced. Also, in this particular oscillator design, the edges of a given signal 150Xb are generated substantially mid-way between corresponding edges of corresponding signal 150X.

In accordance with one aspect of the present invention, each NAND or NOR gate provided in stages 90 may be controlled by a control or bias current or voltage to change the gate speed, thereby affecting the output signal frequency of the ring oscillator. Thus, as shown in FIGS. 3 and 5, control voltage 58, 80 may be applied to current source 55, 78 respectively for such timing purpose. Similarly, in FIG. 7 bias voltage 111 is received by each stage 90.

Particularly in the ring oscillator implementation of FIG. 6, when current flowing from terminal 118 is increased, voltage on node 111 resultantly decreases, and current supplied by devices 126 and 128 of FIG. 7 also increase. In this way, signal pulse edges at output nodes 107, 109 rise faster, thereby crossing the threshold levels of the signal-detecting gates in subsequent stage 90X earlier, as described above. Accordingly, stage 90 delay is reduced, and the oscillation frequency is controllably increased.

I claim:

1. A signal-generating apparatus comprising:

a first metal-oxide-semiconductor (MOS) circuit stage comprising first and second electric input nodes and first and second electric output nodes, wherein the logical level of said first electric input node is the inverse of the logical level of said second electric input node and the logical level of said first electric output node is the inverse of the logical level of said second electric output node, a second MOS circuit stage comprising third and fourth electric input nodes and third and fourth electric output nodes, wherein the logical level of said third electric input node is the inverse of the logical level of said fourth electric input node and the logical level of said third electric output node is the inverse of the logical level of said fourth electric output node, said third electric input node having the same logic level as said first electric output node and being coupled to said first electric output node and said fourth electric input node having the same logic level as said second electric output node and being coupled to said second electric output node, at least one of said first MOS circuit stage and said second MOS circuit stage including a control voltage input for controlling signal delay through each circuit stage, the control voltage input permitting at least one of the electric output nodes to be pulled to a high logical level, the first MOS circuit stage and the second MOS circuit stage each comprising a pair of cross-coupled NOR gates, and a first electric line for coupling said third electric output node to said second electric input node and for providing the logical level of said third electric output node to said second electric input node, and a second electric line for coupling said fourth electric output node to said first electric input node and for providing the logical level of said fourth electric output node to said first electric input node.

2. The signal-generating apparatus of claim 1 further comprising:

at least one intermediate MOS circuit stage, and the first stage is coupled to the second stage through each intermediate MOS circuit stage, each intermediate MOS circuit stage comprising an intermediate input, an intermediate inverted input, an intermediate output, and an intermediate inverted output, each intermediate MOS circuit stage including a control voltage input, and wherein the first electric output is coupled to the intermediate input of one intermediate stage, and the second electric output is coupled to the intermediate inverted input of the one intermediate stage, the second electric input is coupled to the intermediate output of the one intermediate stage, and the second inverted input is coupled to the intermediate inverted output of the one intermediate stage, and wherein each intermediate MOS circuit stage comprises a pair of cross coupled NOR gates.

3. The signal-generating apparatus of claim 1 further comprising:

a third MOS circuit stage comprising a third input, a third inverted input, a third output, and a third inverted output, wherein the third stage receives a third signal at the third input and a third inverted signal at the third inverted input and generates a third signal at the third output and a third inverted signal at the third inverted output, wherein the first electric output node is coupled to the third input, and the second electric output node is coupled to the third inverted input, such that a generated first output from the first electric output node is received as the third signal at the third input, and a first inverted signal from the second electric output node is received as the third inverted signal at the third inverted input, and wherein the third MOS circuit stage comprises a pair of cross coupled NOR gates.

4. The signal-generating apparatus of claim 1 wherein:
the first metal-oxide-semiconductor (MOS) circuit stage and the second metal-oxide-semiconductor (MOS) circuit stage each comprise an input for controlling stage delay.

5. A signal-generating apparatus comprising:
a first metal-oxide-semiconductor (MOS) circuit stage comprising first and second electric input nodes and first and second electric output nodes, wherein the logical level of said first electric input node is the inverse of the logical level of said second electric input node and the logical level of said first electric output node is the inverse of the logical level of said second electric output node, a second MOS circuit stage comprising third and fourth electric input nodes and third and fourth electric output nodes, wherein the logical level of said third electric input node is the inverse of the logical level of said fourth electric input node and the logical level of said third electric output node is the inverse of the logical level of said fourth electric output node, said third electric input node being coupled to said first electric output node and said fourth electric input node being coupled to said second electric output node, a first electric line for providing the logical level of said third electric output node to said second electric input node, and a second electric line for providing the logical level of said fourth electric output node to said first electric input node, said signal-generating apparatus including at least one intermediate MOS circuit stage, the first MOS circuit stage being coupled to the second MOS circuit stage through the at least one intermediate MOS circuit stage, each intermediate MOS circuit stage comprising first and second intermediate electric input nodes and first and second intermediate electric output nodes, the logical level of said first intermediate input node being the inverse of the logical level of said second intermediate input node and the logical level of said second intermediate output node being the inverse of the logical level of said first intermediate output node, the first and second electric output nodes being coupled to first and second intermediate electric input nodes of a first one of said one intermediate MOS circuit stage and said third and fourth electric input nodes being coupled to said first and second intermediate electric output nodes of a last one of said one intermediate MOS circuit stage, the first, second, and each intermediate stage each comprising a pair of cross-coupled gates, said signal generating apparatus including a control voltage input, the control voltage input coupled to at least one of the first MOS circuit stage, the second MOS circuit stage, and to at least one intermediate MOS circuit stage, for controlling signal delay through each circuit stage, the control voltage input permitting at least one of the electric output nodes to be pulled to a high logical level.

6. A signal-generating apparatus comprising:
a first metal-oxide-semiconductor (MOS) circuit stage comprising first and second electric input nodes and first and second electric output nodes, wherein the logical level of said first electric input node is the inverse of the logical level of said second electric input node and the logical level of said first electric output node is the inverse of the logical level of said second electric output node, a second MOS circuit stage comprising third and fourth electric input nodes and third and fourth electric output nodes, wherein the logical level of said third electric input node is the inverse of the logical level of said fourth electric input node and the logical level of said third electric output node is the inverse of the logical level of said fourth electric output node, said third electric input node having the same logic level as said first electric output node and being coupled to said first electric output node and said fourth electric input node having the same logic level as said second electric output node and being coupled to said second electric output node and at least one of said first MOS circuit stage and said second MOS circuit stage including a control voltage input for controlling signal delay through each circuit stage, the control voltage input permitting at least one of the electric output nodes to be pulled to a high logical level, the first MOS circuit stage and the second MOS circuit stage each comprising a pair of cross-coupled NAND gates, and a first electric line for coupling said third electric output node to said second electric input node and for providing the logical level of said third electric output node to said second electric input node, and a second electric line for coupling said fourth electric output node to said first electric input node and for providing the logical level of said fourth electric output node to said first electric input node.

7. The signal-generating apparatus of claim 6 further comprising:
at least one intermediate MOS circuit stage, and the first MOS circuit stage is coupled to the second MOS circuit stage through each intermediate MOS circuit stage, each intermediate MOS circuit stage comprising an intermediate input, an intermediate inverted input, an intermediate output, and an intermediate inverted output, each intermediate MOS circuit stage including a control voltage input, and wherein the first electric output node is coupled to the intermediate input of one intermediate stage, and a first inverted output is coupled to the intermediate inverted input of the one intermediate stage, the third electric input node is coupled to the intermediate output of the one intermediate stage, and a second inverted input is coupled to the intermediate inverted output of the one intermediate stage, and wherein each MOS circuit stage comprises a pair of cross coupled NAND gates.

8. The signal-generating apparatus of claim 6 further comprising:
a third MOS circuit stage comprising a third input, a third inverted input, a third output, and a third inverted output, wherein the third stage receives a third signal at the third input and a third inverted signal at the third inverted input and generates the third signal at the third output and the third inverted signal at the third inverted output, wherein the first electric output node is coupled to the third input, and the second electric output node is coupled to the third inverted input, such that a generated a first output from the first electric output node is received as the third signal at the third input, and a first inverted signal from the second electric output node is received as the third inverted signal at the third inverted input, and wherein the third MOS circuit stage comprises a pair of cross coupled NAND gates.

9. The signal-generating apparatus of claim 6 wherein:

the first metal-oxide-semiconductor (MOS) circuit stage and the second metal-oxide-semiconductor (MOS) circuit stage each comprise an input for controlling stage delay.

* * * * *

UNITED STATES PATENT AND TRADEMARK OFFICE
CERTIFICATE OF CORRECTION

PATENT NO.: 5,909,151

DATED: June 1, 1999

INVENTOR: Oskar N. Leuthold

It is certified that an error appears in the above-identified patent and that said Letters Patent is hereby corrected as shown below:

Column 7, line 4, before "first output" delete "a".

Signed and Sealed this

Second Day of November, 1999

Q. TODD DICKINSON

Attest:

Attesting Officer

Acting Commissioner of Patents and Trademarks